United States Patent
Ngo et al.

[11] Patent Number: 6,096,662
[45] Date of Patent: Aug. 1, 2000

[54] NH₃/N₂ PLASMA TREATMENT TO ENHANCE THE ADHESION OF SILICON NITRIDE TO THERMAL OXIDE

[75] Inventors: Minh Van Ngo, Union City; Darin Arthur Chan, Campbell, both of Calif.

[73] Assignee: Advanced Micro Devices, Inc., Sunnyvale, Calif.

[21] Appl. No.: 08/824,748

[22] Filed: Mar. 26, 1997

[51] Int. Cl.⁷ .................................................. H01L 21/76
[52] U.S. Cl. .......................... 438/798; 438/221; 438/798; 438/424; 438/296; 438/435; 438/786
[58] Field of Search ................................... 438/221, 296, 438/435, 424, 763, 795, 786, 958, 902, 974, 669, 775, 798, 427; 257/760

[56] References Cited

U.S. PATENT DOCUMENTS

| | | | |
|---|---|---|---|
| 5,464,790 | 11/1995 | Hawley | 438/600 |
| 5,665,635 | 9/1997 | Kwon et al. | 438/427 |
| 5,702,977 | 12/1997 | Jang et al. | 148/DIG. 50 |
| 5,726,090 | 3/1998 | Jang et al. | 438/435 |
| 5,780,346 | 12/1996 | Arghavani et al. | 438/296 |

Primary Examiner—Charles Bowers
Assistant Examiner—Thanh Nguyen
Attorney, Agent, or Firm—H. Donald Nelson

[57] ABSTRACT

A method of manufacturing a semiconductor device with improved adhesion between the local interconnect etch stop layer and the thermal oxide in an isolation region. The thermal oxide is treated with an NH₃/N₂ plasma. The local interconnect etch stop layer is either silicon nitride or silicon oxynitride. A layer of a dielectric material such as PECVD SiO₂ is formed on the local interconnect etch stop layer.

4 Claims, 5 Drawing Sheets

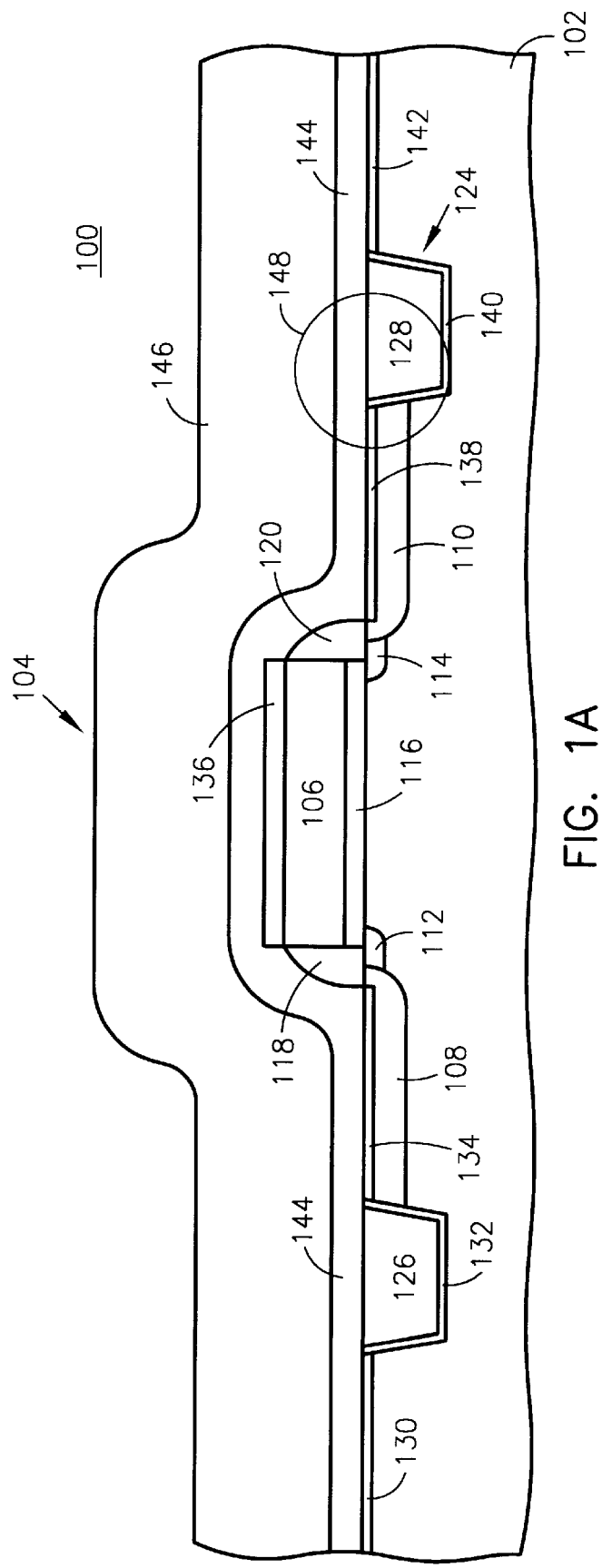
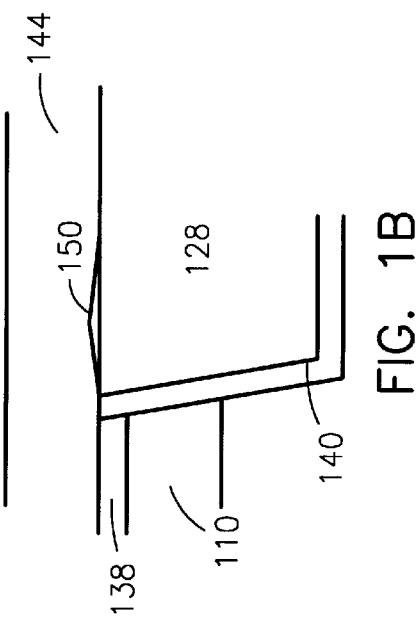
FIG. 1A
FIG. 1B

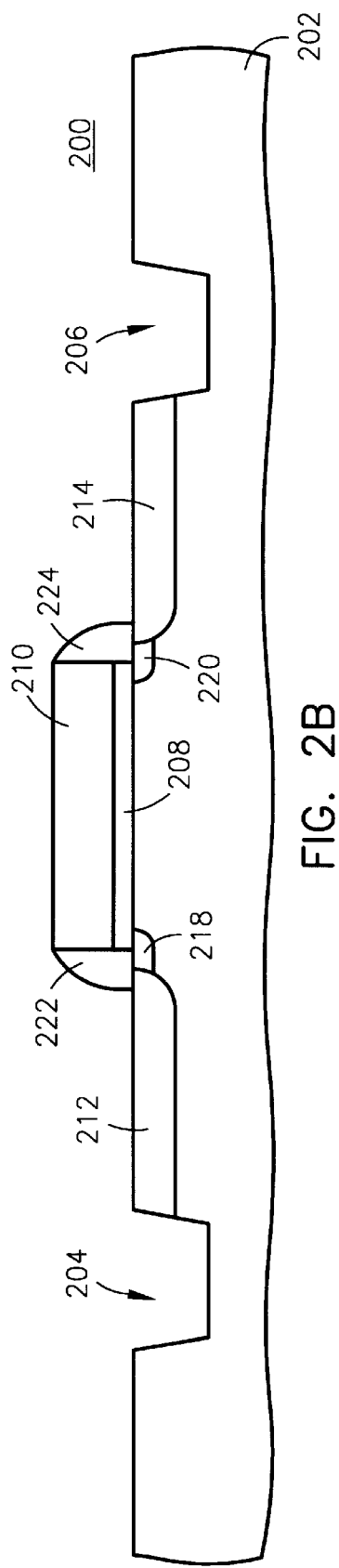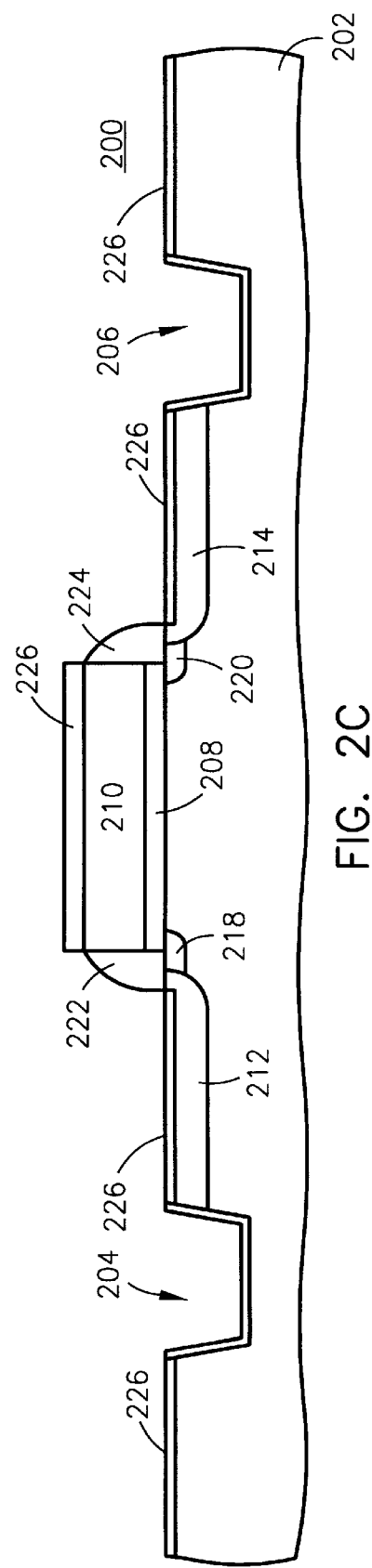

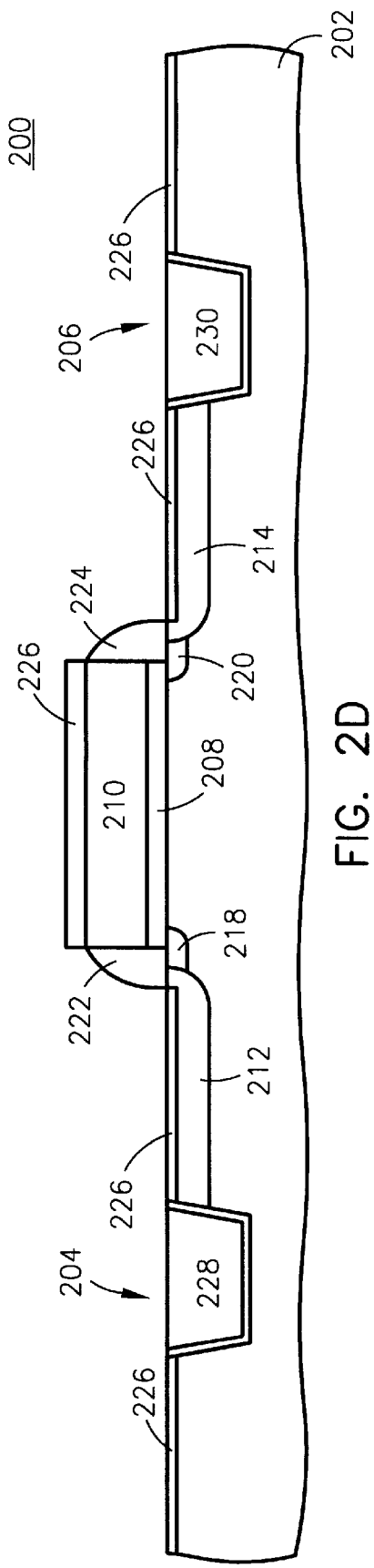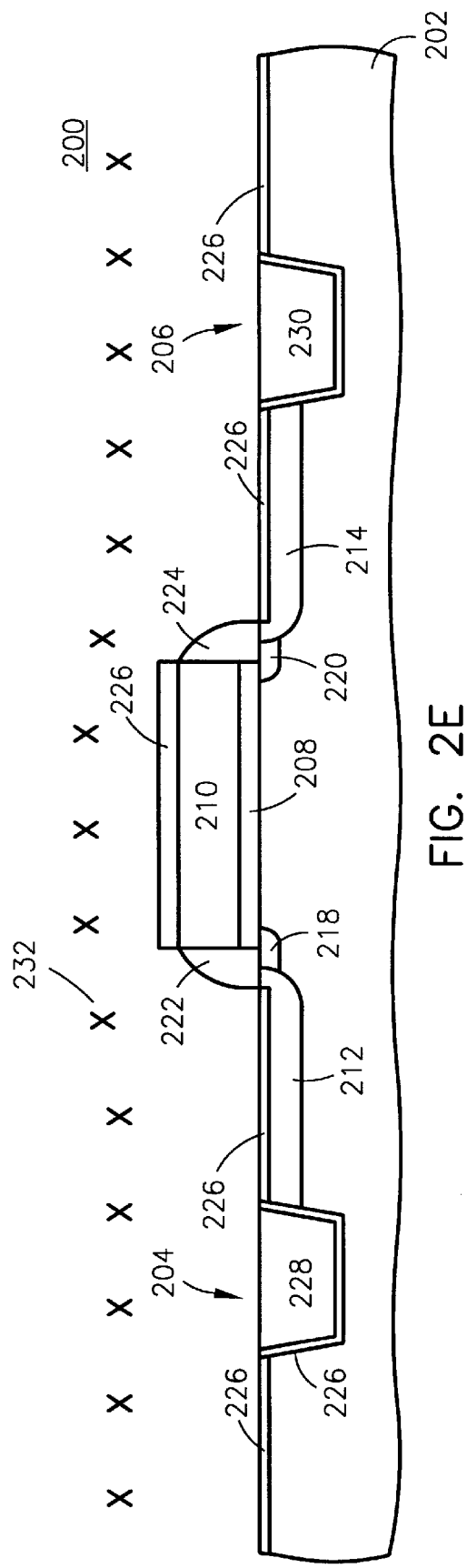

NH₃/N₂ PLASMA TREATMENT TO ENHANCE THE ADHESION OF SILICON NITRIDE TO THERMAL OXIDE

BACKGROUND OF THE INVENTION

1. Field of the Invention

This invention relates generally to a process for the manufacture of high performance semiconductor devices. More specifically, this invention relates to a process to manufacture high performance semiconductor devices where the process enhances the adhesion of the local interconnect silicon nitride layer to thermal oxide by treating the thermal oxide with an $NH_3/N_2$ plasma.

2. Discussion of the Related Art

It has been determined that the local interconnect etch stop layer consisting of $Si_3N_4$ is delaminating from the thermal oxide (TOX) when the overlying TEOS is polished down. Various tests were conducted on semiconductor devices to determine the cause of the delamination. Such delaminations cause low yield problems, performance problems, including catastrophic failure.

Therefore, what is needed is a method of manufacturing semiconductor devices where the local interconnect etch stop layer does not delaminate from the thermal oxide.

SUMMARY OF THE INVENTION

The present invention is directed to a method of manufacturing a semiconductor device with improved adhesion between the local interconnect etch stop layer and the thermal oxide formed as an isolation region. The thermal oxide is treated with $NH_3/N_2$ plasma.

The thermal oxide is formed by the deposition of a densified PECVD $SiO_2$ or LPCVD $SiO_2$.

The local interconnect etch stop layer is either silicon nitride or silicon oxynitride.

A layer of PECVD $SiO_2$ is formed on the local interconnect etch stop layer.

The present invention is better understood upon consideration of the detailed description below, in conjunction with the accompanying drawings. As will become readily apparent to those skilled in the art from the following description, there is shown and described an embodiment or embodiments of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The accompanying drawings incorporated in and forming a part of the specification, illustrate the present invention, and together with the detailed description below serve to explain the principles of the invention. In the drawings:

FIG. 1A shows a portion of a semiconductor device manufactured by a prior art process.

FIG. 1B shows an enlarged portion of the semiconductor device shown in FIG. 1A with a delamination area illustrated.

FIGS. 2A–2F show selected steps in a process for manufacturing a semiconductor device in accordance with the present invention.

DETAILED DESCRIPTION

Figure 2F:
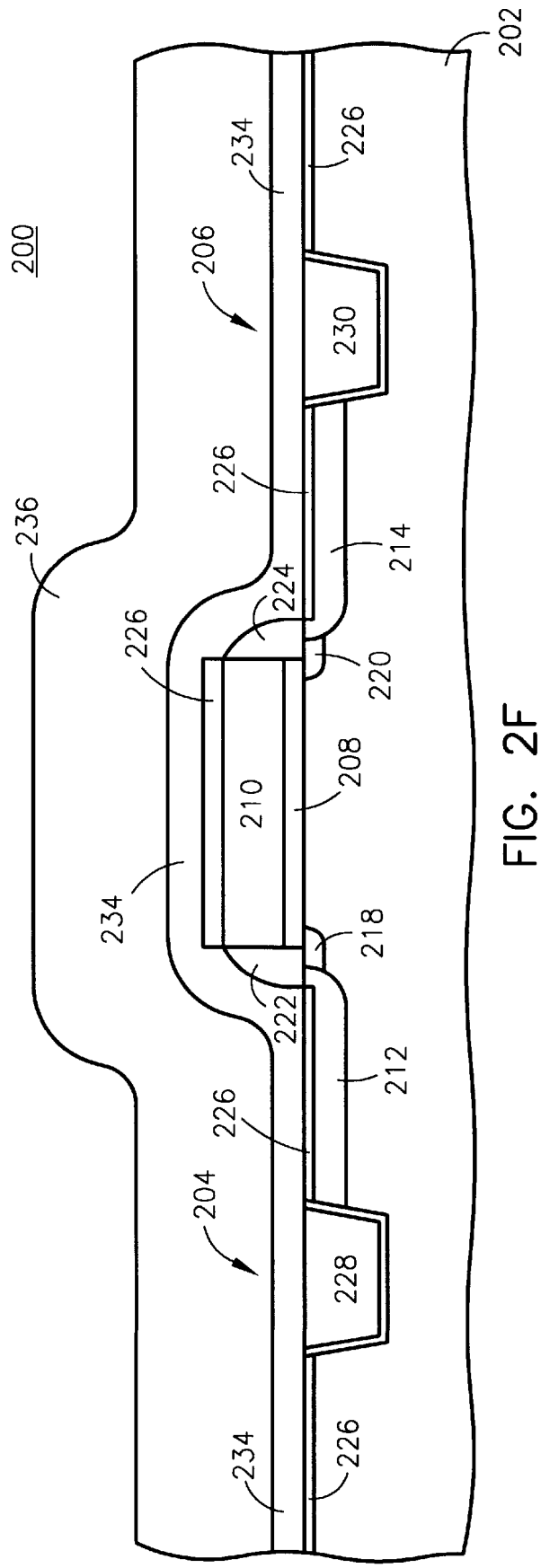

Reference is now made in detail to specific embodiments of the present invention that illustrate the best mode presently contemplated by the inventors for practicing the invention.

FIG. 1A shows a portion of a semiconductor device 100 manufactured by a prior art process. The semiconductor device 100 is formed on a semiconductor substrate 102. The portion of the semiconductor device 100 shown in FIG. 1A shows an FET which comprises a gate 106 typically formed of doped polysilicon, with a source region 108 and a drain region 110. Associated with the source region 108 and the drain region 110 are LDD (lightly doped drain) regions at 112 and 114, respectively. The gate 106 is formed on a gate oxide 116 with sidewall spacers 118 and 120 formed on the sides of the gate 106. The FET 104 is electrically isolated from other devices (not shown) formed in the semiconductor substrate 102 by isolation regions 122 and 124 which can be shallow trenches filled with a nonconducting material such as silicon dioxide or they can be what is known as field oxide (FOX) regions. The isolation regions are shown as shallow trenches filled with silicon oxide ($SiO_2$) shown at 126 and 128. As is known in the semiconductor manufacturing art, a thin layer of a silicide is formed on selected surfaces. Thin layers of silicide are shown at 130, 134, 136, 138, and 142. The typical silicide is titanium silicide ($TiSi_2$). It should be understood that the layers at 132 and 140 are oxide liners and they include the entire inner surface of the trenches 122 and 124. The layer 144 is known as a local interconnect etch stop layer and is typically silicon nitride ($Si_3N_4$) or silicon oxynitride (SiON). The layer 146 is a PECVD (plasma enhanced chemical vapor deposition) $SiO_2$ oxide layer or a TEOS (tetra-ethyl-ortho-silicate) oxide layer. The layer 146 is formed as a layer with sufficient thickness so that it can be polished or "planarized" to form a planar surface suitable for subsequent processing steps such as forming metal layers. It has been determined that during the polishing process the layer 144 delaminates from the silicon oxide such as that formed at 126 and 128. The circle at 148 shows a selected portion of the silicon oxide 128 that is shown in an enlarged view in FIG. 1B. Like numerals are used to denote like elements in FIG. 1B as in FIG. 1A. The delamination of the layer 144 from the silicon oxide layer 128 is indicated at 150.

FIGS. 2A–2F show the structure and selected steps in a method of manufacturing a semiconductor device 200 in accordance with the present invention. Like numerical designations are used in each of the subsequent figures for like elements. FIG. 2A shows a semiconductor substrate 202 with trenches 204 and 206 etched into the surface.

FIG. 2B shows the semiconductor device 200 after a gate oxide layer 208 has been formed, a gate 210 formed on the gate oxide layer, a source region 212 and a drain region 214 formed in the semiconductor substrate 202. LDD (lightly doped drain regions 218 and 220 are formed adjacent to the source region 212 and drain region 214, respectively. Sidewall spacers 222 and 224 are shown formed on the sides of the gate 210. The methods of forming the gate, source and drain structures are well known in the manufacturing art and will not be discussed.

FIG. 2C shows a layer 226 of a silicide formed on selected parts of the semiconductor device 200. The simplest method of for silicide formation is to deposit a metal on bare silicon and to heat-treat this combination. Preferred methods of silicide preparation involves its direct deposition as a compound, or co-deposition of the metal and silicon, which are converted to the silicide by subsequent heat treatment. Of the many deposition techniques described earlier, sputtering has been found to produce films that combine most of the characteristics that are desired in silicides. A typical silicide that can be formed is titanium silicide ($TiSi_2$).

FIG. 2D shows the semiconductor device 200 with trenches 204 and 206 filled with silicon oxide 228 and 230, respectively. The trenches 204 and 206 can be filled by several methods including the PECVD (plasma enhanced chemical vapor deposition) of densified $SiO_2$ and the LPCVD (low pressure chemical vapor deposition) of $SiO_2$.

FIG. 2E shows the semiconductor device 200 receiving an $NH_3/N_2$ plasma treatment indicated by the symbol X 232. The plasma treatment process parameters are as follows:

|          |              |
| -------- | ------------ |
| NH3      | 75 sccm      |
| N2       | 1500 sccm    |
| Power    | 320 watts    |
| Temp     | 400° C.      |
| Pressure | 3.5 torr     |
| Spacing  | 360 mils     |
| Time     | 10–20 seconds |

FIG. 2F shows the semiconductor device 200 with the layer 234 formed on the semiconductor device. The layer 234 is known as a local interconnect etch stop layer and is typically silicon nitride ($Si_3N_4$) or silicon oxynitride (SiON). In addition, the layer 236 is shown formed on the layer 234. The layer 236 is a PECVD (plasma enhanced chemical vapor deposition) $SiO_2$ oxide layer or a TEOS (tetra-ethyl-ortho-silicate) oxide layer. The layer 236 is formed as a layer with sufficient thickness so that it can be polished or "planarized" to form a planar surface suitable for subsequent processing steps such as forming metal layers.

Figure 3:
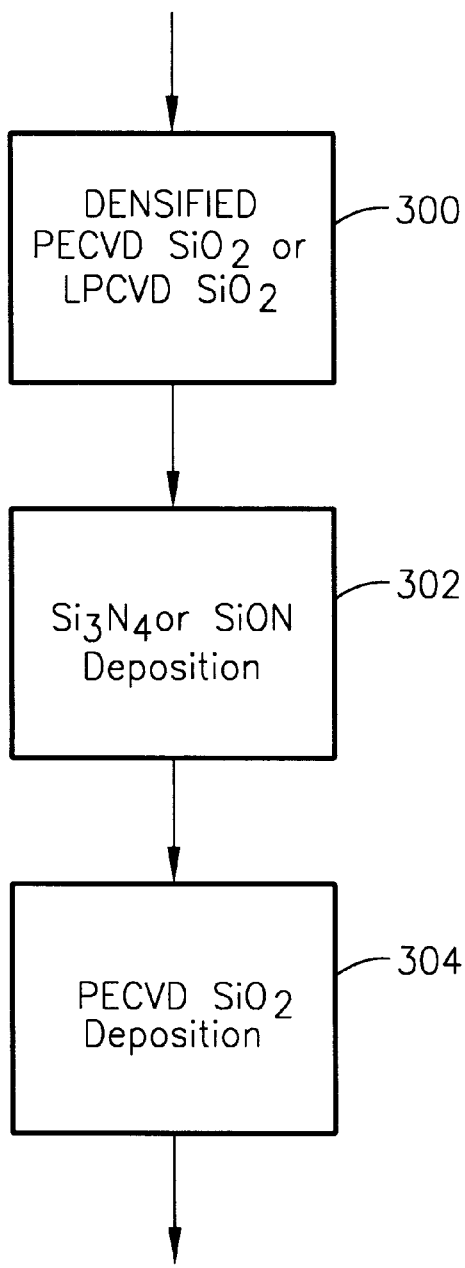
FIG. 3 shows a flow diagram of selected steps in a prior art process for the manufacture of a semiconductor device.

FIG. 3 is a process flow diagram showing selected steps of a prior art process to manufacture a semiconductor device. The selected steps shown begin with the formation 300 of a densified layer of PECVD $SiO_2$ or a layer of LPCVD $SiO_2$. The next step is the deposition 302 of silicon nitride ($Si_3O_4$) or silicon oxynitride (SiON). After the deposition 302 of silicon nitride the local interconnect layer of PECVD $SiO_2$ is deposited 304.

Figure 4:
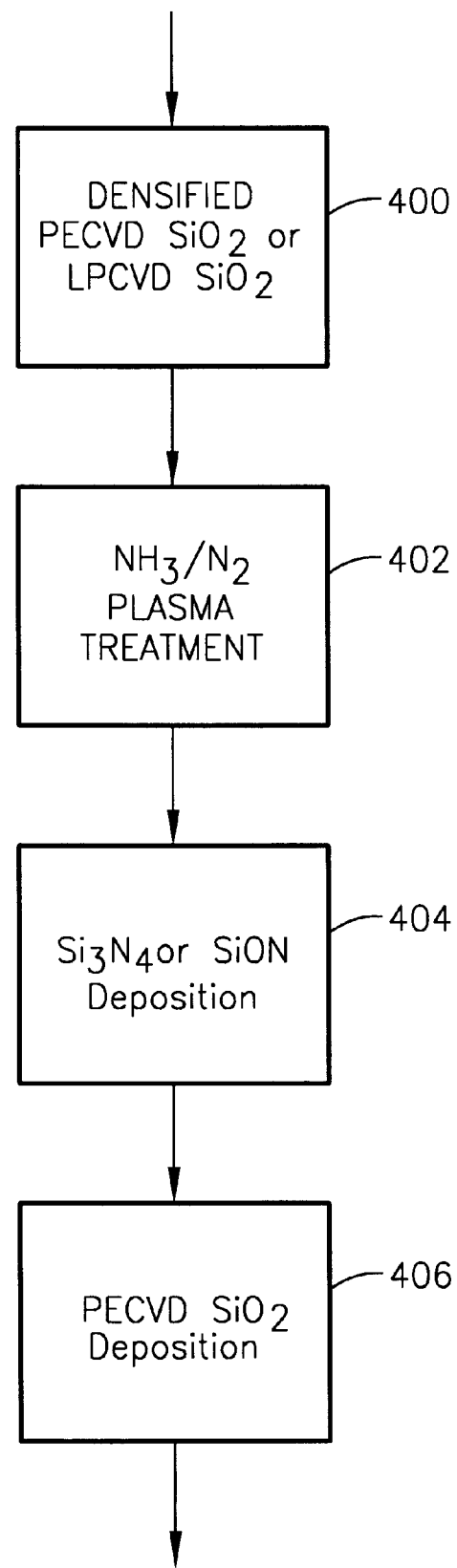
FIG. 4 shows a flow diagram of selected steps in a process in accordance with the present invention for the manufacture of a semiconductor device.

FIG. 4 is a process flow diagram showing selected steps of a process to manufacture a semiconductor device in accordance with the present invention. The selected steps shown begin with the formation 400 of a densified layer of PECVD $SiO_2$ or a layer of LPCVD $SiO_2$. The next step is an $NH_3/N_2$ plasma treatment 402 of the PECVD $SiO_2$ or LPCVD $SiO_2$. After the plasma treatment 402 step, the $Si_3N_4$ local interconnect etch stop layer is deposited 404. The next step in the process is the deposition 406 of a layer of PECVD $SiO_2$.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What we claim is:

1. A method of manufacturing a semiconductor device, wherein the method comprises:

forming isolation regions in a surface of a semiconductor substrate;

filling the isolation regions completely with a nonconductive material;

forming a local interconnect etch stop layer on the surface of the semiconductor substrate including a surface of the isolation regions;

forming an oxide layer on the local interconnect etch stop layer;

treating the nonconductive material with $NH_3/N_2$ plasma.

2. The method of claim 1, wherein forming an isolation region is accomplished by:

forming a trench in the surface of the semiconductor substrate; and filling the trench with a dielectric material selected from the group consisting of densified PECVD $SIO_2$ and LPCVD $SiO_2$.

3. The method of claim 2, wherein forming a local interconnect etch stop layer is accomplished by depositing a layer of material selected from the group consisting of silicon nitride and silicon oxynitride.

4. The method of claim 3, wherein forming an oxide layer on the local interconnect etch stop layer is accomplished by forming a layer of PECVD $SiO_2$.

* * * * *